United States Patent [19]

Koch et al.

[11] Patent Number: 4,825,398

[45] Date of Patent: Apr. 25, 1989

[54] METHOD AND APPARATUS FOR CONVERTING AN INPUT SCANNING SEQUENCE INTO AN OUTPUT SCANNING SEQUENCE

[75] Inventors: Andreas Koch, San Francisco, Calif.; Roger Lagadec, Rumlang; Daniele Pelloni, Zurich, both of Switzerland

[73] Assignee: Willi Studer, AG., Regensdorf, Switzerland

[21] Appl. No.: 658,776

[22] Filed: Oct. 9, 1984

[30] Foreign Application Priority Data

Oct. 6, 1983 [CH] Switzerland ............... 5 427/83

[51] Int. Cl.[4] ............................................. G06F 15/31
[52] U.S. Cl. ............................................. 364/724.1
[58] Field of Search ........................... 364/723, 724

[56] References Cited

U.S. PATENT DOCUMENTS

| | | | |
|---|---|---|---|
| 3,632,905 | 1/1972 | Thomas | 364/724 |
| 3,988,607 | 10/1976 | Eggermont et al. | 364/724 |
| 3,997,773 | 12/1976 | Van Essen et al. | 364/724 |
| 4,270,026 | 5/1981 | Shenoi et al. | 364/723 |
| 4,386,430 | 5/1983 | Treiber | 364/724 |
| 4,460,890 | 7/1984 | Busby | 364/723 |
| 4,527,020 | 7/1985 | Ito | 364/723 |
| 4,528,639 | 7/1985 | Edwards | 364/723 |
| 4,584,659 | 4/1986 | Stikvoort | 364/724 |
| 4,602,285 | 7/1986 | Beaulier et al. | 364/724 |

FOREIGN PATENT DOCUMENTS

| | | |
|---|---|---|
| 0052847 | 7/1985 | European Pat. Off. . |
| 0084592 | 4/1986 | European Pat. Off. . |

*Primary Examiner*—Gary V. Harkcom
*Assistant Examiner*—Dale M. Shaw
*Attorney, Agent, or Firm*—Helfgott & Karas

[57] ABSTRACT

Method and apparatus for converting an input scanning sequence into an output scanning sequence, where scan values of an input scanning sequence occurring with an input scanning frequency are converted into an output scanning sequence whose scan values occur with an output scanning frequency. To process scanning sequences with alternating scanning frequencies with limited computing and storage capacities, a single one-stage digital filter is provided for processing the input scanning sequence using a limited number of filter coefficients, further filter coefficients supplied thereto by calculation from existing filter coefficients.

6 Claims, 4 Drawing Sheets

METHOD AND APPARATUS FOR CONVERTING AN INPUT SCANNING SEQUENCE INTO AN OUTPUT SCANNING SEQUENCE

BACKGROUND OF THE INVENTION

The present invention relates to a method and an apparatus for converting a scan value of an input scanning sequence occurring with an input scanning frequency into scan values of an output scanning sequence occurring with an output scanning frequency.

One such method and apparatus is already known from European Patent Application No. 0052 847. In this method and apparatus, the input scanning sequence is converted into the output scanning sequence by multiple digital filtering of the input scan values, in a multiple digital filter. The input scanning sequence is converted in several steps into the output scanning sequence. This process is controlled by the momentary time difference between the input and the output scanning times. This difference is used for selecting a momentary filter coefficient set. An important part of this apparatus is therefore provided for determining this time difference.

Hitherto known apparatuses for determining the time difference between input and output scanning times are unable to follow rapidly changing input and output scanning frequencies. This is on the one hand because the intermediate store of a multistage scanning converter is small and on the other hand the processing of time-varying scanning frequencies leads to time differences between the momentarily effectively present scanning values and the calculated time differences between the particular input and output scan values. Thus, in the case of rapidly changing scanning frequencies, the intermediate store can no longer intermediately store sufficient scan values, which means that the apparatus can no longer fulfill its function. A further disadvantage of the multistage scan rate converter is that in the case of continuously changing input and output scanning frequencies, in which both the output and input scanning frequency can assume higher and lower values, the operating sequence of the individual stages of the multistage digital filter must be interchanged, which cannot take place without interrupting operation.

SUMMARY OF THE INVENTION

The present invention solves the problem of providing a method and an apparatus for converting changing input and output scanning rates while requiring only a limited amount of computing power and data storage.

The advantages resulting from the invention are mainly that scanning sequences can be processed which have continuously varying scanning frequencies and particularly also, e.g. if a scanning frequency which was originally higher or lower than the other scanning frequency changes in such a way that it is now lower or higher than the other scanning frequency. The invention makes it possible to convert a signal with a time-variable scan rate into a signal with a random other time-variable or a constant scan rate. Filters can be used whose filter order is smaller than the total filter order of a multistage filter. This reduces the expenditure for coefficient storage and for the calculation of new scan values.

BRIEF DESCRIPTION OF THE DRAWINGS

The present invention is described in greater detail herein with reference to illustrative embodiments thereof and the attached drawings, wherein.

DETAILED DESCRIPTION OF THE PREFERRED EMBODIMENTS

Figure 1:
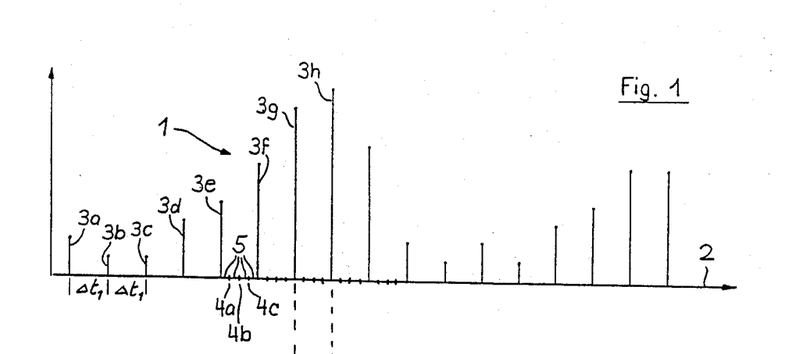
FIG. 1 shows an input scanning sequence of a signal.

In FIG. 1, an input scanning sequence 1 is plotted on a time axis 2. The individual scan values 3a, 3b, 3c, etc. follow one another by a time interval $\Delta t_1$. It is possible to see further scan values 4a, 4b, 4c, etc. on time axis 2 following one another by time interval 5, which are significantly smaller than time interval $\Delta t_1$. The signal amplitude of said further scan values is zero. Thus, an input scanning frequency $\omega_1$ results from the reciprocal of $\Delta t_1$.

Figure 2:
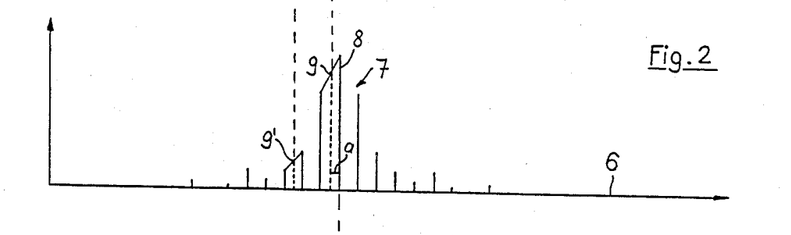
FIG. 2 shows the filter coefficients of a digital filter.

In FIG. 2, the values of filter coefficients 7 of a digital and more particularly transverse filter are plotted on a time axis 6. The filter coefficient to be counted as the filter axis is designated 8. In addition, values of coefficients 9, 9' obtained from an interpolation are plotted.

Figure 3:
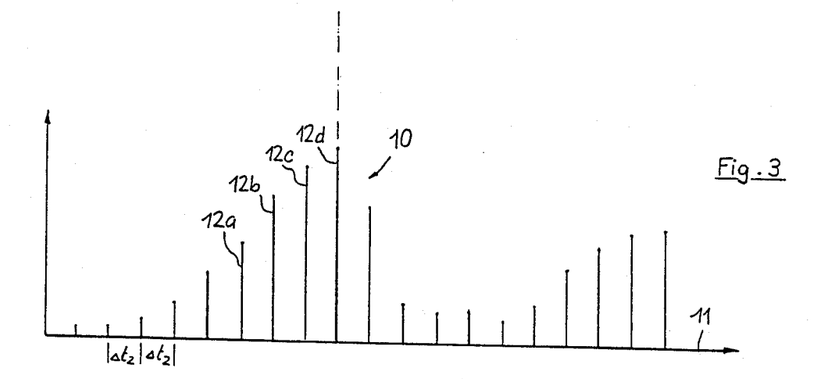
FIG. 3 shows an output scanning sequence of the signal.

FIG. 3 shows an output scanning sequence 10 plotted on a time axis 11 with scan values 12a, 12b, 12c, etc., which follow one another by a time interval $\Delta t_2$.

Thus, an output scanning frequency $\omega_2$ is obtained from the reciprocal of $\Delta t_2$.

Figure 4:
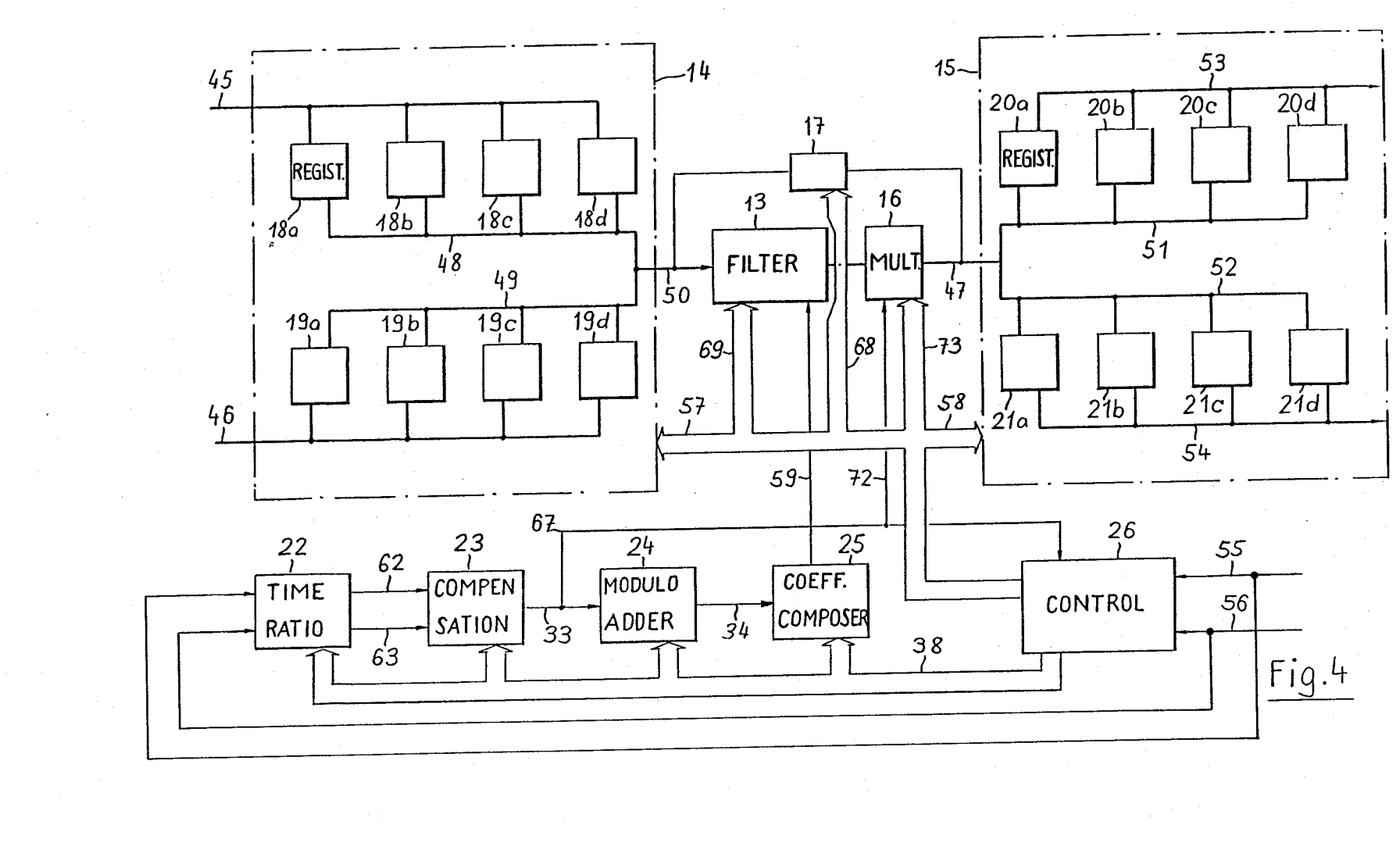
FIG. 4 shows an apparatus for converting scanning sequences in diagrammatic form.

FIG. 4 shows an apparatus for converting an input scanning sequence into an output scanning sequence comprising a single one-stage digital filter 13, preferably constructed as a transverse filter, also known as a transversal or FIR (finite impulse response) filter. Stores 14 and 15 are arranged on either side of filter 13. A multiplier 16 is connected in series with filter 13 and a bypass 17 is connected in parallel with filter 13 and multiplier 16. Store 14 comprises in each case two groups 18, 19 of parallel-connected storage units or registers 18a, b, c, d and 19a, b, c, d. One group 18 stores scan values of a first channel and the other group 19 stores values of a second channel. In the same way, store 15 is organized into groups 20, 21 of similar storage units or registers 20a, 20b, 20c, 20d and 21a, 21b, 21c and 21d for two channels.

Channels 45 and 46 could be, for example, the two channels of a stereophonic audio system. The filter 13 is fast enough to handle the two streams of digital data in a time multiplex mode. However, if desired, two separate filters 13 could be used, with appropriate modifications to other parts of the circuit. The parallel arrangement of the sets of units or registers 18, 19, 20 and 21 permits this time multiplex mixing operation of filter 13 as needed for Case (a) and Case (b), as needed, as described below.

In order to prepare the filter coefficients for filter 13, there is also a circuit comprising a time measuring circuit 22, a compensating circuit 23, a modulo formation circuit called "modulo adder" 24, and an interpolation or coefficient composer circuit 25. A control 26 is used for controlling the operation of the individual components of the apparatus.

Figure 5:
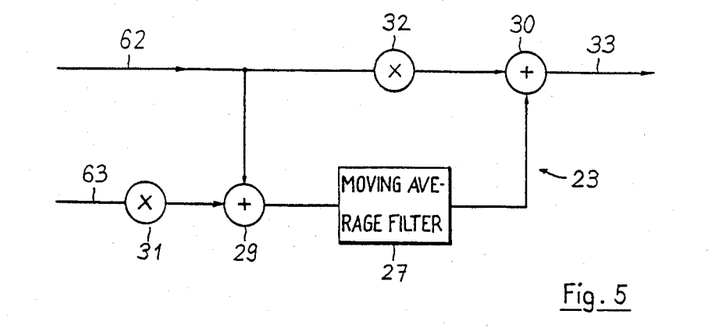
FIG. 5 is a circuit for compensating time differences.

FIG. 5 partly shows the construction of the compensating circuit 23 with a compensating or moving average filter 27 and two adding elements 29, 30, as well as two multipliers 31, 32. Compensating circuit 23 has two inputs 62, 63 and one output 33.

Figure 6:
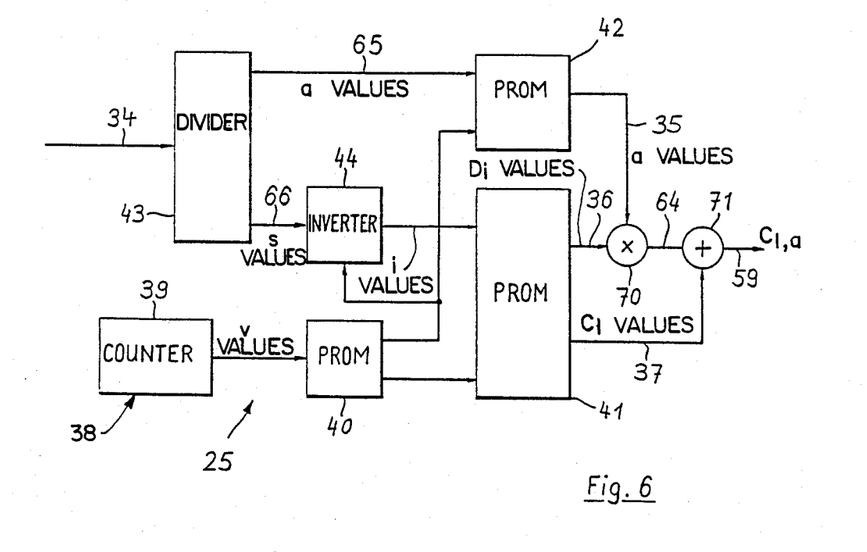
FIG. 6 is an interpolation circuit.

FIG. 6 diagrammatically shows the construction of interpolation circuit 25 in which a counter 39 is connected upstream of a store (PROM) 40, which is in turn connected to two further stores 41, 42. A divider circuit 43 and inverter 44 are connected upstream of stores 41 and 42. Lines 35, 36 and 37 form the outputs of stores 41 and 42. Lines 35 and 36 feed into a multiplier 70, whose output 64, together with line 37, feeds into adding element 71, the output of which appears on line 59.

A distinction must be made between the two different operating states describing the operation of the invention method and apparatus:

(a) the output scan rate is higher than the input scan rate; $\omega_2 > \omega_1$ (b) the output scan rate is lower than the input scan rate; $\omega_2 > \omega_1$ Case (a):

Scan value 3a, 3b, 3c, etc. from an input scanning sequence 1, e.g. from two separate channels of an audio playback unit, pass via lines 45, 46 to store 14. Each of the nntering scan values of the input scanning sequence 1 passes into one of the storage units 18a, b, c, d and 19a, b, c, d. These storage units, in each case, receive a single scan value 3a, 3b, 3c etc. for a short time. As will be described in greater detail below, the scan values are subsequently fed via lines 48, 49, 50 to filter 13, where they are processed and leave the latter as output scanning sequence 10 via line 47. In store 15, this output scanning sequence 10 can again be subdivided into separate output scanning sequences for two separate channels. For this purpose, output scanning sequence 10 is fed to storage units 20a, b c, d and 21a, b, c, d via lines 51 and 52 and leaves the same via lines 53 and 54.

Control 26 receives the input scanning frequencies $\omega_1$ at input 55 and the output scanning frequencies $\omega_2$ at input 56. By means of control bus 57, 58, it supplies control instructions to stores 14 and 15. Within stores 14 and 15, control instructions are transferred in a per se known and therefore not shown manner to the two individual storage units 18, 19, 20, 21, where the output scan values 12a, 12b, 12c etc. are accurately synchronized with the desired output scanning frequency. This means that the individual scan values only pass through storage units 20 and 21 and that the input scan values remain in the storage units 18 and 19 until they are polled by the control instructions and are supplied to filter 13. In this operating case, store 15 consequently fulfills no function. Control 26 synchronizes the activity of filter 13 with the output scanning sequence 10.

Case (b):

The input scan values 3a, 3b, 3c, etc. once again pass via lines 45 and 46 into store 14, pass through the latter and then through filter 13. At multiplier 16 the entering output scan values are multipled with a ratio value of the input and output scanning frequencies. Corresponding instructions are supplied to multiplier 16 via control bus 73. The output scan values 12a, 12b, 12c etc. then pass via line 47 into store 15, where they are received by the individual storage units 20a, b, c, d and 21a, b, c, d.

In this Case (b) where the output frequency is lower than the input frequency, control 26 synchronizes the activity of filter 13 with the input scanning sequence 1, and this means that the input scan values 3a, 3b, 3c, etc. simply pass through the storage units 18a, b, c, d and 19a, b, c, d and after treatment in the filter 13 are stored in storage units 20a, b, c, d and 21a, b, c, d of store 15. They remain there until control 26 gives output instructions to store 15. Output of the output scan values 12a, b, c, etc. then takes place synchronously with the output scanning sequence 10.

Using the example of Case (a) where the output frequency is greater than the input frequency, the operation of filter 13, as well as of circuits 22 to 25 for the preparation of filter coefficients 9, 9' will now be explained.

The operation of filter 13 can be gathered from FIGS. 1 to 3 which shows Case (a). Firstly, the input scanning sequence 1 is provided with further scan values 4a, 4b, 4c etc. For example, $2^7$ further scan values are added between two scan values 3a and 3b. This gives a grid, which is fine enough to make it possible to complete the setting of filter 13 therein with minimum error with respect to an output scan value.

With respect to its output scanning frequency $\omega_2$ and the phase position of its scan values 12a, 12b, 12c, etc. the output scanning sequence 10 must be looked upon as being established. The signal amplitude of scan values 12a, 12b, 12c, etc. is sought.

For the purpose of processing the input scanning sequence 1, the digital filter 13 is so set on a grid with the scan values 4a, 4b, etc. that the filter axis 8 (FIG. 2) successively appears with each of the scan values 12a, 12b, 12c, etc. of the output scanning sequence 10 in, as far as is possible, the same phase position. In this phase position, filter 13 produces a value for the signal amplitude of the particular scan value, shown applied to value 12d in FIGS. 1 to 3.

As can be gathered from FIGS. 1 to 3, the phase position of filter coefficients 7 does not coincide with the phase position of input scan values 3a, 3b, 3c, etc. The result of such a filtering would lead to a signal amplitude of zero for scan value 12d, which is certainly not correct. This error could be eliminated by a filter with an infinitely large number of filter coefficients but this would lead to vast computing expenditure and is consequently unusable.

As opposed to this, the invention filter 13 has a limited number of filter coefficients 7, e.g. 6399, 3839, 6655, etc., as a function of the use of the invention in some particular environment, such as radio, studio or radio, or studio recordings. The filter order or the number of stored coefficients 7 is calculated as the product of the number of additional scan values 4a, b, c, e.g. $2^7$, an the number of the input scan values 3, e.g. between about 30 and about 60, of input scanning sequence 1 used for calculating the output scan value, minus 1.

New coefficients can be obtained by interpolation for all scan values of the input scanning sequence 1, which are not in phase with filter coefficient 7 of the filter 13 set to a given scan value of the output scanning sequence 10. This e.g. applies in FIGS. 1 and 2 for scan values 3g and 3h, for which new filter coefficients 9 and 9' must be calculated. This can be done by linear interpolation between two nodes or filter coefficients 7 or by quadratic interpolation between three interpolation filter coefficients 7. Account must be taken of correspondingly more filter coefficients for higher order interpolations.

In FIG. 2, each filter coefficient is shown by a vertical line such as 8. The slope at the tops of the coefficients 9 and 9' are obtained by drawing this line between the top points of two neighboring coefficients. The slope, therefore, only defines the geometrical location of the top points of all coefficients obtainable by linear interpolation between the two already existing coefficients.

Instead of an interpolation between stored filter coefficients, the filter coefficients of filter 13 can also be obtained for random values of a function, which is multiplicatively coupled to a window function. Only the constants of the particular functions are stored. Those function values which time-coincide with the input scan values are calculated. One possible function is:

$$\frac{\sin(nT)}{nT}$$

Instead of storing a set of filter coefficients and computing other filter coefficients by interpolation between stored coefficients, it is also possible to compute all of the required filter coefficients when they are needed. Therefore, we define a function as, for example:

$$y = \frac{\sin x}{x}$$

With this function, it is possible to compute values of y for given values of x. In such cases, the addresses of stored filter coefficients or the output sampling times are equivalent to values of x. Filter coefficients are represented by values of y. Now, as such functions often are indefinitely periodic, it is necessary to restrict the computation of values of y to a desired range of values of x. Therefore, a window function is applied to the values of y. This window function results often in a multiplication of issued y values with one for a specific range of x values and with zero for all the other values of x.

$$y = \frac{\sin x}{x}$$

or any other function is computed in a function generator. This function is defined by a number of constants such as max. amplitude of x, phase and periodocity. The variable x of said function corresponds to a time difference produced by time difference circuit 22 or the value m. The function generator is usually followed by a window function generator. Such arrangements are well known.

These interpolated filter coefficients are continuously calculated for filter 13 in circuits 22 and 25 and are supplied to filter 13 via line 59. Filter 13 operates in per se known manner, see:

(1) Theory and Application of Digital Signal Processing by L. R. Rabiner and B. Gold, Prentice Hall, Inc.
(2) Digitale Systeme zur Signalverarbeitung by H. W. Schüssler, Springer Verlag, Berlin/Heidelberg, New York.

For preparing the filter coefficients 7, the time measuring circuit 22 is supplied with the input scanning frequency $\omega_1$ via input 55 and the output scanning frequency $\omega_2$ via input 56. The construction of such a time measuring circuit 22 is known, for example, from European Patent Application No. 0084592.

In order to quickly sense switches in the relative values of the input and output sequences, i.e., when one changes to become larger than the other, time measuring circuit 22 calculates the ratio of the time differences between the two scan values 3a, b and 12a, b, of the input and output scanning sequences 1 and 10:

$$\frac{\Delta t_1}{\Delta t_2} \text{ for Case (b) and } \frac{\Delta t_2}{\Delta t_1} \text{ for Case (a)}$$

This ratio is supplied to compensating circuit 23 as a 16 bit number via line 62 and as an 8 bit number via line 63. The number passed via line 62 is averaged with a larger number of preceding values, as known from EP No. 0084592, while the number on line 63 corresponds to the values measured with $2^8$ counting pulses. In compensating circuit 23, see FIG. 5, the values on lines 62 and 63 are multiplied by $2^8$ in multipliers 31 and 32. This means that 16 bit numbers are supplied to adding element 29 and 24 bit numbers to adding element 30. Prior to the multiplication in multiplier 32, 16 bit numbers from line 62 are supplied to adding element 29, where they are mixed with the values from line 63 multiplied to a 16 bit number by multiplier 31.

The mixed value from lines 62 and 63 is again averaged in compensating filter 27 over several cycles, as in the time measuring circuit 22, and supplied to an adding element 30, where this value is averaged with the originally averaged value from time measuring circuit 22. In this way, in the case of changes in the scan rates, a rapid reaction of the circuit can be brought about because there is no need to wait until a sufficiently larger number of values has influenced averaging in time measuring circuit 22. Even a few new values can greatly influence the time measurement following mixing in adding element 29.

Figure 9:
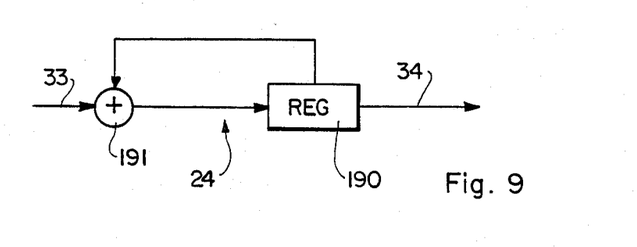
FIG. 9 shows a circuit detail.

Referring to FIG. 9, the compensated ratios of the time difference are supplied from compensating circuit 23 to the modulo formation circuit 24, which comprises a series connection of a register 190 with a storage location and an adding stage 191. After the register, there is a return to the adding stage 191. The two successively following values are mixed in this modulo formation circuit 24 and subsequently supplied to the interpolation circuit 25 on line 34.

The input sampling sequence on lines 45 and 46 are streams of individual datawords. Each such dataword is composed of a specific number of bits depending on the format chosen. Such a dataword usually comprises a sync-bit. Clockpulses of a well known clockpulse circuit are triggered by those sync-bits, and such clockpulses are transmitted through lines 55 and 56 according to the sequence of datawords conveyed by the lines 45 and 46 or 53 and 54.

It must be borne in mind in connection with the explanation of the operation of interpolation circuit 25 that in the present operating Case (a), where $\omega_2 > \omega_1$, the filter axis 8 of digital filter 13 with the filter coefficients 7 is successively set to each of the output scan values 12a, b, c, d, etc. For example, for calculating the output scan value 12d, e.g. 56 input scan values are successively multiplied with corresponding filter coefficients and the products are summed. This takes place in per se known manner in filter 13. For example, interpolation circuit 25 determines which filter coefficients 9, 9', etc. is used for each of these 56 input scan values 3a, b.

For this purpose, control 26 starts counter 39 (FIG. 6) via control bus 38, for each of these cycles, in which e.g. said 56 multiplications are carried out. The counter continuously supplies v values (e.g. from 1 to 56), which act as addresses for the input scan values 3a, b, c, etc. stored in a store 41 of filter 13. In addition, so-called m values are introduced into a divider circuit or network 43 for each cycle from modulo formation circuit 24 via line 34. These m values are data words consisting of 15 bits and determine the time with respect to the input scan value grid of the output scan value (e.g. 12d) essential for the particular cycle. Divider network or circuit 43 comprises 24 parallel lines from the block 24 each carrying one bit of a 24-bit word which are split into three groups of 7, 8 and 8 parallel lines. The 7 lines carry the 7 most significant bits of an m-word and represent s values. The 8 following lines carry the 8-bits of an a value. The last 8 lines carry the 8 last significant bits of the m-word, and those lines have an open end and the bits they are carrying are simply lost.

The first seven bits of the data word m give a value s for the input scan values 3a, 3b, c, etc. indicating the nearest filter coefficient, while the last 8 bits give the distance "a" (FIG. 2) between the next-following filter coefficient 8 and the input scan value 3h. Thus, the following interpolation formula is obtained for filter coefficients $C_i$:

$$C_{i,a} = C_i + D_i \cdot a \quad \text{with}$$
$$D_i = C_{i+1} - C_i \quad \text{and}$$
$$i = k \cdot v + s$$

in which k is a factor taking account of the grid system used, while $D_i$ designates the difference between two adjacent filter coefficients.

The v values are supplied to store 40 and then enter stores 41 and 42. Following partial circuit 43, the a values pass via line 65 into store 42. The s values pass via inverter 44 into store 41, where all the filter coefficients $C_i$ and all the differences $D_i$ are stored. The entering i values formed in store 44 from the s values and the v values, consequently act as addresses for the particular $C_i$ and $D_i$ values, which leave the store 41 via lines 36 and 37. The $D_i$ values are multiplied in multiplier 70 with the a values from line 35 and are subsequently supplied via line 64 to adding element 71, where they are combined with the $C_i$ values from line 37. A completely interpolated filter coefficient $C_{i,a}$ leaves adding element 71 via line 59.

As the filter coefficients 7 are symmetrical with respect to the filter axis 8, only the first half thereof has to be stored. Thus, in store 40, the second half of the filter coefficients is recoded and in inverter 44 the s values for the second half of the filter coefficient are inverted. The v values, e.g. from the 56th value are counted back and the a values are subtracted from the maximum value thereof. This technique conserves memory capacity. For example, assume that there are 56 filter coefficients already stored. A new filter coefficient to be computed is to be specified by the values a, s and v. If the values of v are less than 56/2, the system takes those values. If the values of v are between 56/2 and 56, then the store 40 produces new values v'=56−1−v, and the bits of the s value are inverted in the inverter 44 and the value a is replaced by 256−a in the store 42, assuming that 256 is the maximum a values may have.

In operating Case (b) in which the output scan rate is less than the input scan rate, the output scanning sequence is provided with additional scan values, which are assumed to be zero level. The activity of filter 13 and also the preparation of the filter coefficients are synchronized with the input scanning sequence. Correspondingly, the v values give addresses for products of input scan values and filter coefficients and the m values the time of the input scan value essential for the particular cycle with respect to the output scanning grid.

In order to be able to switch filter 13 and the circuit for preparing filter coefficients from operating Case (a) to operating Case (b), control 26 is connected to line 33 by line 67. Line 33 transmits data, giving the ratio of time differences $$\frac{\Delta t_1}{\Delta t_2} \text{ or } \frac{\Delta t_2}{\Delta t_1}$$

between successive scan rates of the input and output scanning sequences. It is possible to derive from said data, in the case of varying scanning frequencies, changes from one operating case to the other. This is continuously determined by control 26. On transition from a higher output scanning frequency than the input scanning frequency, input scan values stored in store 14 can be directly used as output scan values, as long as the input scanning frequency roughly corresponds to the output scanning frequency. They are directly supplied to store 15 via bypass 17. This operating state lasts 56 cycles, if 56 input scan values are used for forming an output scan value 12.

On passing from a lower output scanning frequency to a higher output scanning frequency than the input scanning frequency, it is possible to switch over immediately because control 26 operates in such a way that the data for the higher output scanning frequency are always read. The stores are then filled to such an extent with products from input scan values with filter coefficients, that first output scan values can be supplied to store 15.

Figure 7:
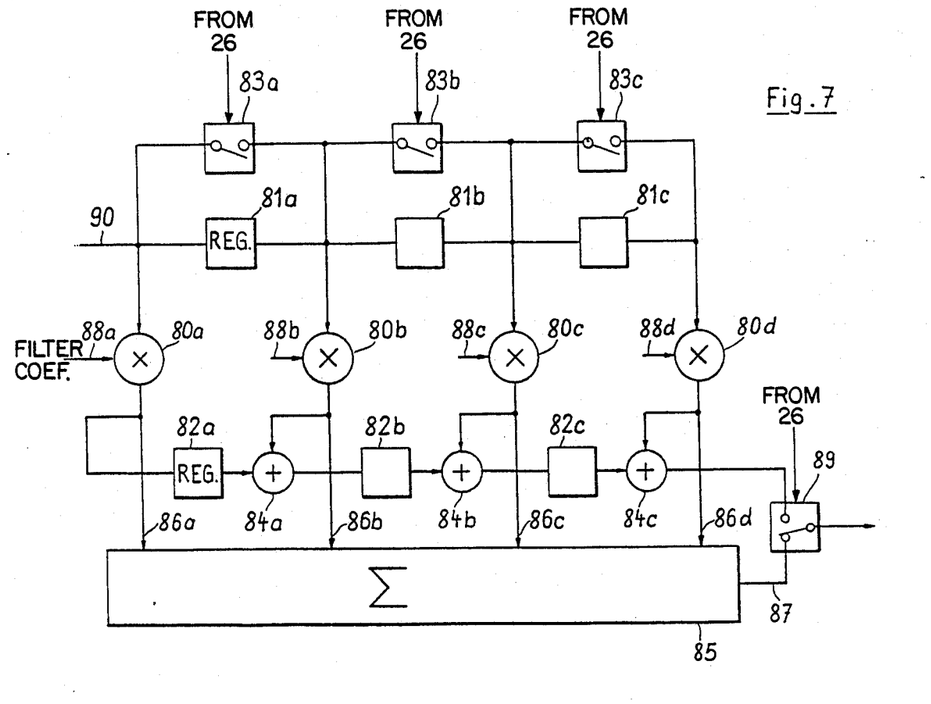
FIGS. 7 and 8 show two embodiments of the filter.

FIG. 7 shows an embodiment of filter 13 which essentially comprises the first and second canonical L structure, (see Schüssler reference above at p. 63, re "canonical"). The filter has a certain number of multipliers 80a, 80b, 80c, 80d. The number of said multipliers 80 corresponds to the number of input scan values 3a, 3b, 3c, etc. (e.g. 56), which are used for calculating an input scan value 12d. Correspondingly reduced by 1 is the number of time lag circuits or registers 81a, b, c and 82a, b, c arranged in each case between two multipliers 80. Switches 83a, b, c are connected in parallel to registers 81a, b, c. Adding elements 84a, b, c are arranged in series to registers 82a, b, c. A summing circuit 85 is arranged in parallel to multipliers 80. Multipliers 80a, b, c also have an input 88a, b, c, d for the filter coefficients. A changeover switch 89 is used for changing filter 13 between Cases (a) and (b). FIG. 7 shows devices 83 and 89 as "switches" since that is their function and it improves understanding. Of course, they are actually high speed automatic semi-conductor switching devices operated by control 26, as indicated.

During each operating cycle of the filter, i.e. between the arrival of two successive scan values 3a, b c or 12a, b, c etc., there is a multiplication in multiplier 80 and an addition either in summing circuit 85 or in the adding elements 84. In one embodiment, there are 56 multiplications and additions performed in parallel during each cycle. In Case (a), in which $\omega_2 > \omega_1$, switches 83a, b, c and 89 are in the represented position. A first scan value arriving at input 90 is on the one hand supplied to register 81a where it remains stored until the second scan value reaches input 90 and on the other hand is supplied to multiplier 80a in which the scan value is multiplied with a filter coefficient and supplied to the summing circuit 85. When the second scan value reaches input 90, this is once again supplied to multiplier 80a and register 81a, which now supplies the first scan value to multiplier 80b, etc. When a scan value reaches input 90, summing circuit 85 in each case supplies an output scan value via output 87, which comprises a sum of four successive input scan values, in each case multiplied by a filter coefficient. In filter 13 of this invention, there are not four, but, for example, 56 successive scan values which are summed in a filter with 56 multipliers and 55 registers, etc.

In Case (b), where $\omega_1 > \omega_2$, the switches 83 are closed and changeover switch 89 is in the not shown position. A scan value reaching input 90 is supplied to all the multipliers 80 and is simultaneously multipled with all the filter coefficients. The resulting four products are further processed in the following way.

The first product is fed from multiplier 80a to register 82a. From multipliers 80b, 80c and 80d, the products pass into adding elements 84a, b, c, where the product from multiplier 80b is summed with a product from register 82a. A third product from multiplier 80c is added to this sum, now stored in register 82b, in adding element 84b in a further cycle. Whenever a new scan value reaches input 90, a sum is fed out from changeover switch 89, comprising four successive input scan values, which are in each case multiplied by a filter coefficient.

If $\omega_2 > \omega_1$, then in registers 81a, b, c input scan values are passed on in stepwise manner and the output scan value is formed for each cycle in summing circuit 85. If $\omega_1 > \omega_2$, then partial sums are passed on stepwise manner in registers 82a, b, c and a new value is added during each step.

Figure 8:
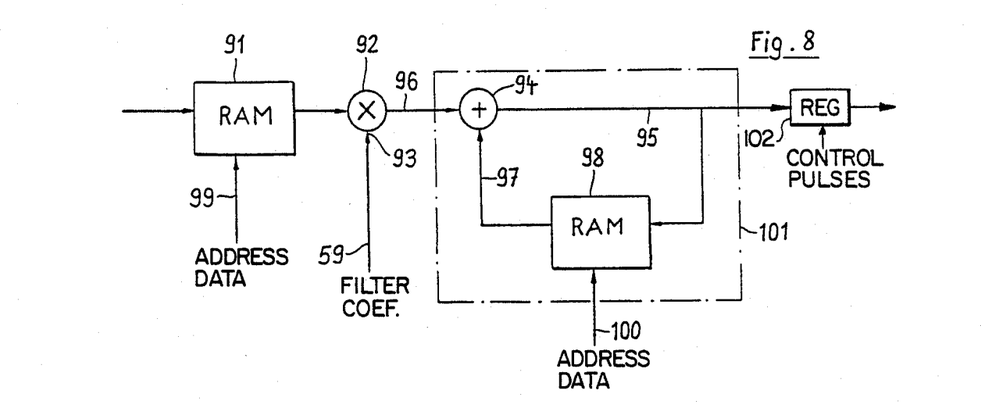

A filter 13 according to the invention can also be constructed as shown in FIG. 8. This embodiment comprises a store 91, a single multiplier 92 with an input 93 for filter coefficients and an adding element 94 with an output 95 and an input 96, 97, a further store 98 being connected between output 95 and input 97. Stores 91 and 98 also have per se known inputs 99 and 100 for store addresses. Together with store 98, adding element 95 forms an accumulator circuit 101.

For Case (a), where $\omega_2 > \omega_1$, a number of successive scan values (e.g. 56) are read into corresponding storage locations in store 91. Read-out scan values are supplied to multiplier 92, multiplied there with a filter coefficient and subsequently supplied to adding element 94. A storage location is only used for a single value in store 98. Within one cycle, e.g. all 56 scan values are read out once from store 91 and supplied to the multiplier and adding element 94 where said values are continuously accumulated. An intermediate result of the accumulation is in each case stored in store 98. If all the scan values of store 91 are read out once, the complete content of store 91 is displaced by one scan value and the aforementioned process begins again.

For Case (b), where $\omega_1 > \omega_2$, only one storage location is used for a single scan value in store 91, whereas in store 98, all the storage locations (e.g. 56) are used for several values. A particular scan value is removed in the same cycle the same number of times from store 91 and is multiplied with the same number of filter coefficients in multiplier 92 as values are stored in store 98 (e.g. 56 times). Each value is removed once per cycle from store 98 and is added in adding element 94 to the product from the multiplier 92 and again read into the old storage location. At the end of a cycle, the oldest value from store 91 is not read in again after the addition and is instead read out via output 95. A new scan value is read into store 98 and the complete store content is displaced by one storage location or one value and these processes start again.

In the construction according to FIG. 8, a single multiplier is operated in time multiplex process in the filter. Changeover from operating state (a) to (b) here takes place by a different association of the store addresses. The addresses applied in operating case a during each cycle to store 91 are applied to store 98 in Case (b). In order to achieve the iterative looping type operation of the FIG. 8 embodiment, register 102 at the output of the accumulator circuit 101 is controlled with respect to the output sampling sequences so that new values at the proper output sampling times only are outputted.

While the invention has been described in detail above, it is to be understood that this detailed description is by way of example only, and the protection granted is to be limited only within the spirit of the invention and the scope of the following claims.

What is claimed is:

1. A method for converting the scan values of an input scanning sequence occurring with an input scanning frequency into an output scanning sequence occurring with an outputs scanning frequency, comprising the steps of:
   storing a set of fixed coefficients;
   measuring the time difference between input and output sampling times of input and output scanning sequences;
   calculating another set of coefficients based on said fixed coefficients and said time difference measured, using interpolating between said fixed coefficients; and
   filtering said input sampling sequence using said calculated coefficients and obtaining an output scanning sequence.

2. A method for converting the scan values said values of an input scanning sequence occurring with an input scanning frequency into an output scanning sequence occurring with an output scanning frequency, comprising the steps of:
   defining a particular function;
   storing a set of fixed values representing the constants of a predetermined function;
   measuring the time difference between input and output scanning times of input and output scanning sequences;
   computing a set of coefficients based on said particular function and said time difference measured; and
   filtering said input sampling sequence using said computed coefficients and producing an output scanning sequence.

3. An apparatus for converting the scan values of an input scanning sequence occurring with an input scanning frequency into scan values of an output scanning sequence occurring with an output scanning frequency, comprising:
- a digital filter;
- a circuit for measuring the time difference between input and output scanning times;
- a circuit for generating filter coefficients connected to said digital filter and said circuit for measuring the time difference, comprising a store for a set of fixed filter coefficients and an interpolating circuit for producing another set of coefficients used for filter.

4. An apparatus for converting the scan values of an input scanning sequence occurring with an input scanning frequency into scan values of an output scanning sequence occurring with an output scanning frequency, comprising:
- a digital filter;
- a circuit for measuring the time difference between input and output scanning times;
- a circuit for generating filter coefficients connected to said digital filter and said circuit for measuring the time difference, comprising a store for a set of fixed values, a store for a program of a particular function and a circuit for computing a set of coefficients out of said values and said particular function.

5. An apparatus for converting the scan values of an input scanning sequence occurring with an input scanning frequency into scan values of an output scanning sequence occurring with an output scanning frequency, comprising:
- a digital filter having an input and an output;
- circuit means for the direct calculation of filter coefficients from stored filter coefficients and from the relative time differences between the input and output scan values;
- two storage means, one of which is connected to the input of said digital filter and said circuit means, and the other of said two storage means being connected to the output of said digital filter and said circuit means; and
- a bypass for bypassing said digital filter, said bypass bypasses said two storage means to each other.

6. Apparatus as set forth in claim 5 wherein said circuit means includes a compensating circuit for compensating the scanning frequency changes.

* * * * *